United States Patent
You et al.

(10) Patent No.: US 10,141,447 B2
(45) Date of Patent: Nov. 27, 2018

(54) SEMICONDUCTOR DEVICE

(71) Applicant: Samsung Electronics Co., Ltd., Suwon-si (KR)

(72) Inventors: Jong Ho You, Seongnam-si (KR); Deok Han Bae, Hwaseong-si (KR); Sang Young Kim, Yangpyeong-gun (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/841,515

(22) Filed: Dec. 14, 2017

(65) Prior Publication Data

US 2018/0286810 A1    Oct. 4, 2018

(30) Foreign Application Priority Data

Apr. 3, 2017 (KR) .................. 10-2017-0042972

(51) Int. Cl.
| | |
|---|---|
| *H01L 29/786* | (2006.01) |
| *H01L 23/535* | (2006.01) |
| *H01L 27/092* | (2006.01) |
| *H01L 29/08* | (2006.01) |
| *H01L 29/45* | (2006.01) |
| *H01L 29/16* | (2006.01) |

(Continued)

(52) U.S. Cl.
CPC ...... *H01L 29/78618* (2013.01); *H01L 23/535* (2013.01); *H01L 27/0924* (2013.01); *H01L 29/0843* (2013.01); *H01L 29/0847* (2013.01); *H01L 29/16* (2013.01); *H01L 29/161* (2013.01); *H01L 29/1608* (2013.01); *H01L 29/41725* (2013.01); *H01L 29/41766* (2013.01); *H01L 29/45* (2013.01)

(58) Field of Classification Search
CPC ..... H01L 29/02; H01L 29/06; H01L 29/0843; H01L 29/0847; H01L 29/41725; H01L 29/41766; H01L 29/41775; H01L 29/41783; H01L 29/66636; H01L 29/7858; H01L 29/78618
See application file for complete search history.

(56) References Cited

U.S. PATENT DOCUMENTS

| | | |
|---|---|---|
| 7,323,409 B2 | 1/2008 | Griffin, Jr. et al. |
| 8,922,003 B2 | 12/2014 | Tan et al. |
| 9,293,362 B2 | 3/2016 | Lee et al. |

(Continued)

FOREIGN PATENT DOCUMENTS

| | | |
|---|---|---|
| JP | 05082469 | 4/1993 |
| KR | 100629260 | 9/2006 |
| KR | 20140055183 | 5/2014 |

OTHER PUBLICATIONS

Disclosure of Invention 22512: "Contact Bottom Silicide Void" slides/description.

*Primary Examiner* — Eduardo A Rodela
(74) *Attorney, Agent, or Firm* — Onello & Mello, LLP.

(57) ABSTRACT

A semiconductor device includes an active fin extended in a first direction on a substrate. A gate structure extends in a second direction, wherein the gate structure intersects the active fin and covers an upper portion of the active fin. A source/drain region is positioned on the active fin adjacent to the gate structure. A silicide layer is on the source/drain region. A contact plug is connected to the source/drain region. A void is present between the silicide layer and the contact plug.

20 Claims, 16 Drawing Sheets

(51) Int. Cl.
*H01L 29/417* (2006.01)
*H01L 29/161* (2006.01)

(56) References Cited

U.S. PATENT DOCUMENTS

| | | |
|---|---|---|
| 2005/0146035 A1 | 7/2005 | Griffin, Jr. et al. |
| 2013/0187264 A1 | 7/2013 | Tan et al. |
| 2014/0175659 A1 | 6/2014 | Lee et al. |
| 2016/0233164 A1* | 8/2016 | Choi .................. H01L 27/0924 |
| 2016/0307839 A1 | 10/2016 | Olson et al. |

* cited by examiner

SEMICONDUCTOR DEVICE

CROSS-REFERENCE TO RELATED APPLICATION

This U.S. non-provisional application claims priority to Korean Patent Application No. 10-2017-0042972 filed on Apr. 3, 2017 in the Korean Intellectual Property Office, and all the benefits accruing therefrom under 35 U.S.C. 119, the disclosure of which in its entirety is incorporated herein by reference.

BACKGROUND

1. Technical Field

The present inventive concepts relate to a semiconductor device.

2. Description of Related Art

As demands for high-performance, high-speed, and/or multifunctionality in semiconductor devices increase, a degree or level of integration of semiconductor devices continues to advance. In the manufacturing of a semiconductor device having a fine pattern in accordance with the trend for a high degree of integration in semiconductor devices, it is necessary to implement patterns having a relatively fine width or a relatively narrow separation distance. To overcome the various limitations associated with planar metal oxide semiconductor FETs (MOSFETs), a semiconductor device including a FinFET having a channel of a three-dimensional structure has been developed.

SUMMARY

Example embodiments of the present inventive concepts provide a semiconductor device having a void positioned below a contact plug.

According to an example embodiment of the present inventive concepts, a semiconductor device includes an active fin extended in a first direction on a substrate. A gate structure extends in a second direction, wherein the gate structure intersects the active fin and covers an upper portion of the active fin. A source/drain region is positioned on the active fin adjacent to the gate structure. A silicide layer is on the source/drain region. A contact plug is connected to the source/drain region. A void is present between the silicide layer and the contact plug.

According to an example embodiment of the present inventive concepts, a semiconductor device comprises a substrate having a first active region and a second active region containing impurities having different conductivity types. A first source/drain region is positioned in the first active region and has an upper surface in which a first recess region is formed. A first contact plug is positioned on the first recess region of the first source/drain region. A first void is between the first source/drain region and the first contact plug. A second source/drain region is positioned in the second active region, and has an upper surface in which a second recess region is formed. A second contact plug is on the second recess region of the second source/drain region. A second void is between the second source/drain region and the second contact plug. The first void is located at a vertical position that is lower than a vertical position of the second void.

According to an example embodiment of the present inventive concepts, a semiconductor device comprises an active fin extending in a first horizontal direction on a substrate. A gate structure extends in a second horizontal direction on the substrate, the second horizontal direction different than the first horizontal direction. The gate structure intersects the active fin and covers an upper portion of the active fin. A source/drain region is positioned on the active fin at a lower side portion of the gate structure. A silicide layer is on the source/drain region. A contact plug is on the source/drain region, the contact plug extending in a vertical direction relative to the first horizontal direction and the second horizontal direction, a lower portion of the contact plug is in contact with at least a portion of the silicide layer. A void is present between the silicide layer and the contact plug.

BRIEF DESCRIPTION OF DRAWINGS

These and/or other aspects and advantages of the present inventive concepts will become apparent and more readily appreciated from the following description of thereby describing in detail example embodiments thereof, taken in conjunction with the accompanying reference to the attached drawings, in which of which:

FIG. 2A is a cross-sectional view of the semiconductor device of FIG. 1 taken along line I-I', while

FIG. 3A is a cross-sectional view corresponding to FIG. 2A, and FIG. 3B is a cross-sectional view corresponding to FIG. 2B;

DETAILED DESCRIPTION OF EMBODIMENTS

Embodiments of the present inventive concepts will now be described in detail with reference to the accompanying drawings.

Figure 1:
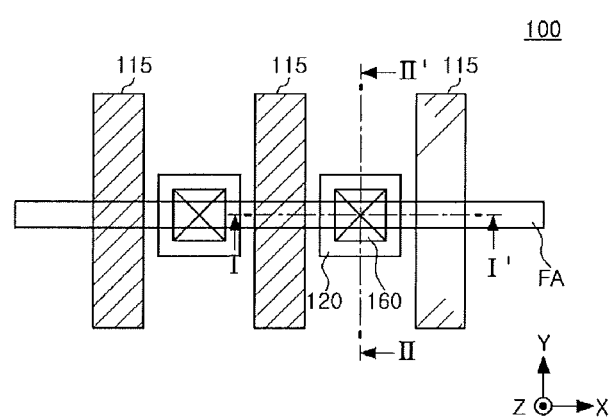
FIG. 1 is a layout view of a semiconductor device according to an example embodiment in accordance with the present inventive concepts.

FIG. 1 is a layout view of a semiconductor device according to an example embodiment in accordance with the present inventive concepts. Furthermore, FIGS. 2A and 2B are cross-sectional views of the semiconductor device of FIG. 1 taken along line I-I' and II-II', respectively, of this embodiment.

Figure 2A:
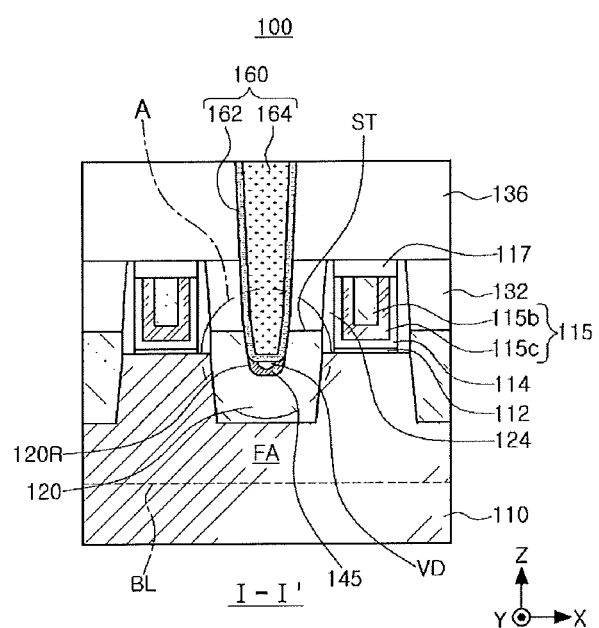
Figure 2B:
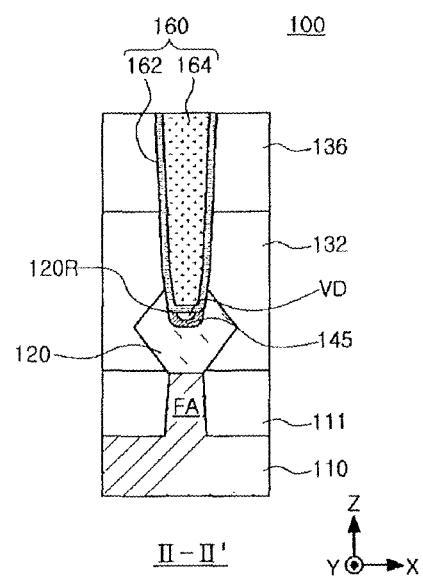
FIG. 2B is a cross-sectional view of the semiconductor device of FIG. 1 taken along line II-II'.

Referencing FIGS. 2A and 2B along with FIG. 1, a semiconductor device 100 may comprise a substrate 110 having a fin-type active region FA.

The substrate 110 may comprise a semiconductor material such as Si or Ge, or a compound semiconductor such as SiGe, SiC, GaAs, InAs, InP, or any other compound semiconductor known to those of ordinary skill in the art. In some embodiments, the substrate 110 may have a silicon on insulator (SOI) structure. The substrate 110 may have a conductive region, for example, a well doped with an impurity or a structure doped with an impurity.

On the substrate 110, a lower sidewall of the fin-type active region FA is covered or at least partially covered with a device isolation layer 111, and the fin-type active region FA may include an upper region protruding above the device isolation layer 111 in a direction (in a Z direction) substantially perpendicular to a main surface (labeled as being in an X-Y plane) of the substrate 110. The fin-type active region FA may be extended in a first direction (an X direction). A bottom level of the fin-type active region FA is indicated by a dotted line BL in FIG. 2A. Throughout this specification, the fin-type active region FA may also be referred to as an active fin.

In some embodiments, an interface insulating film 112, a gate insulating film 114, and a gate electrode 115 may be disposed on the fin-type active region FA. The gate insulating film 114 and the gate electrode 115 may extend in a second direction (for example, the Y direction) intersecting the first direction (for example, the X direction), while covering at least a part of an upper surface and both side walls of the fin-type active region FA and at least an upper surface of the device isolation layer 111. In a region in which the fin-type active region FA and the gate electrode 115 intersect, a fin-type field effect transistor (FinFET) may be formed.

In some embodiments, the interface insulating film 112 may be obtained by oxidizing a surface of the fin-type active region FA. The interface insulating film 112 may serve to prevent interface failure between the fin-type active region FA and the gate insulating film 114.

In some embodiments, the interface insulating film 112 may be formed of a low dielectric material film having a low dielectric constant (for example, 9 or less), for example, a silicon oxide film, a silicon oxynitride film, a combination thereof, or any suitable low dielectric material film having a low dielectric constant known to those of ordinary skill in the art. In some other embodiments, the interface insulating film 112 may be formed of a silicate or a combination of a silicate and a material described above.

The gate insulating film 114 may be formed of a silicon oxide film, a high dielectric film, or combinations thereof. The high dielectric film may comprise a material having a greater dielectric constant (for example, about 10 to 25) than that of a silicon oxide film. For example, the high dielectric film may be formed of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, a combination thereof, or any suitable material known to those of ordinary skill in the art. The gate insulating film 114 may be formed in an atomic layer deposition (ALD), chemical vapor deposition (CVD), or physical vapor deposition (PVD) process.

In some embodiments, the gate electrode 115 may include a first gate electrode 115b and a second gate electrode 115c. The first gate electrode 115b may serve to control a work function of the electrode. The second gate electrode 115c may serve to fill a space formed in an upper portion of the first gate electrode 115b. The first gate electrode 115b may serve as a diffusion prevention layer.

The first gate electrode 115b and the second gate electrode 115c may be formed of different and distinct materials. The first gate electrode 115b may include, for example, a metallic nitride such as a titanium nitride film (TiN), a tantalum nitride film (TaN), a tungsten nitride film (WN), or any suitable material known to those of ordinary skill in the art. The second gate electrode 115c may include, for example, a metallic material such as aluminum (Al), tungsten (W), molybdenum (Mo), or any other suitable material known to those of ordinary skill in the art, or a semiconductor material such as doped polysilicon.

The interface insulating film 112, the gate insulating film 114, and the gate electrode 115 in combination, may form a gate structure. Both side walls of the gate structure may be covered at least partially with a gate spacer 124. An upper surface of the gate structure may be covered with a protective layer 117.

The gate spacer 124 may be formed of silicon nitride, silicon oxynitride, combinations thereof, or any insulative material known to those of ordinary skill in the art.

The protective layer 117 may prevent an undesired foreign substance or element such as oxygen from penetrating into a plurality of gate electrodes 115. In addition, the protective layer 117 may prevent a physical phenomenon in which a threshold voltage of the FinFET is altered. For example, the protective layer 117 may be formed of a silicon nitride film ($Si_3N_4$), a silicon oxynitride film (SiON), carbon-containing silicon oxynitride film (SiCON), a combination thereof, or any suitable material known to those of ordinary skill in the art.

In some embodiments, source/drain regions 120 may be disposed in the fin-type active region FA on both or either sides of the gate electrode 115, for example at a lower side portion of the gate electrode 115. In some embodiments, the source/drain regions 120 may include a semiconductor layer that is epitaxially grown from the fin-type active region FA. The source/drain regions 120 may include a recess region 120R. The recess region 120R may be formed to a depth sufficient enough to allow a portion of a contact plug 160 to be disposed therein. The source/drain regions 120 may have a raised or elevated source/drain structure having an upper end ST (or an upper surface) at a level higher than that of an upper surface of the fin-type active region FA. As represented in FIG. 2B, the source/drain regions 120 may have a substantially pentagonal shape, but example embodiments are not limited thereto. Alternatively, the source/drain regions 120 may have various shapes. For example, the source/drain regions 120 may have any of a polygonal, a circular, a rectangular shape, or another shape known to those of ordinary skill in the art.

In some embodiments, the source/drain regions 120 may include a selectively epitaxially grown plurality of SiGe layers. The plurality of SiGe layers may have respectively different Ge contents creating different ratios of Si to Ge. The plurality of SiGe layers may be doped with a p-type impurity. In some other embodiments, the source/drain regions 120 may be formed of an epitaxially grown Si layer or an epitaxially grown SiC layer. The Si layer or the SiC layer may be doped with an n-type impurity.

In some embodiments, a first interlayer insulating film 132 may be formed between the plurality of gate electrodes 115. The first interlayer insulating film 132 may be formed to cover the source/drain regions 120 between two gate electrodes 115 which are adjacent to each other. The first interlayer insulating film 132 may be formed of a silicon oxide film, but this embodiment is not limited to a silicon oxide film, and another suitable insulating material may be employed.

A second interlayer insulating film 136 may be formed on the protective layer 117 and the first interlayer insulating film 132. The second interlayer insulating film 136 may be formed of a silicon oxide film, but embodiments are limited thereto. In some example embodiments, at least one of the first interlayer insulating film 132 and the second interlayer insulating film 136 may be formed of a tetra ethyl orthosilicate (TEOS) film. In some other embodiments, at least one of the first interlayer insulating film 132 and the second interlayer insulating film 136 may be an ultra-low K film having a ultra-low dielectric constant (for example, a dielectric constant of about 2.0 to 2.4). Two examples of an ultra-low K film are SiOC and a SiCOH films. However, embodiments are not limited thereto.

In some embodiments, the contact plug 160 may be disposed at or on the recess region 120R of the source/drain region 120 to be electrically connected to the source/drain region 120. In some embodiments, the contact plug 160 may be extended in a third direction (for example, a Z direction) perpendicular to an upper surface (an X-Y plane) of the substrate 110 from an inside of the recess region 120R. In some embodiments, the contact plug 160 passes through the first and second interlayer insulating films 132, 136. The contact plug 160 may be surrounded by the first interlayer insulating film 132 and the second interlayer insulating film 136 to be insulated in the horizontal x and y directions from other conductive layers in the semiconductor system 100. The contact plug 160 may have a circular, an elliptical, or a polygonal cross-sectional shape taken along the X-Y plane.

As represented in FIGS. 2A and 2B, the contact plug 160 may have a tip or distal region located in the recess region 120R. The contact plug 160 may additionally include a conductive barrier layer 162 and a conductive layer 164. The conductive barrier layer 162 may surround a lower surface and at least a portion of a side wall of the conductive layer 164. The conductive barrier layer 162 may be formed of a conductive metal nitride film. In some embodiments, the conductive barrier layer 162 may be formed of TiN, TaN, AlN, WN, combinations thereof, or any other combination known to those skilled in the art. The conductive layer 162 may be formed of W, copper (Cu), Al, an alloy thereof, combinations thereof, or any other combination known to those skilled in the art.

In some embodiments, a silicide layer 145 may be disposed on one region of the source/drain region 120. Inside the recess region 120R of the source/drain region 120, the silicide layer 145 may be disposed between the source/drain regions 120 and a tip of the contact plug 160. Specifically, the silicide layer 145 may be positioned between the source/drain regions 120 and the conductive barrier layer 162 at a tip or distal end of the contact plug 160.

In some embodiments, a void VD may be positioned between the silicide layer 145 and the contact plug 160. The void VD may be positioned or present between the conductive barrier layer 162 and the silicide layer 145. The void VD has a width W1 which may be narrower than a width W2 of a lower portion of the contact plug 160. Therefore, at least a portion of the silicide layer 145 may be in contact with the conductive barrier layer 162. Similarly, the void VD may be sealed or enclosed by the silicide layer 145 and the conductive barrier layer 162.

The void VD may be located at a vertical position in the z-direction lower than an upper end ST of the source/drain region 120. In addition, the void VD may be located at a vertical position lower than an upper surface of the fin-type active region FA disposed below the gate structure. However, the position of the void VD is not limited thereto.

In some example embodiments, the silicide layer 145 may contain titanium (Ti), cobalt (Co), nickel (Ni), tantalum (Ta), platinum (Pt), germanium (Ge), carbon (C), or combinations thereof, or other suitable silicide materials, in addition to Si. For example, the silicide layer 145 may be titanium silicide.

Figure 3A:
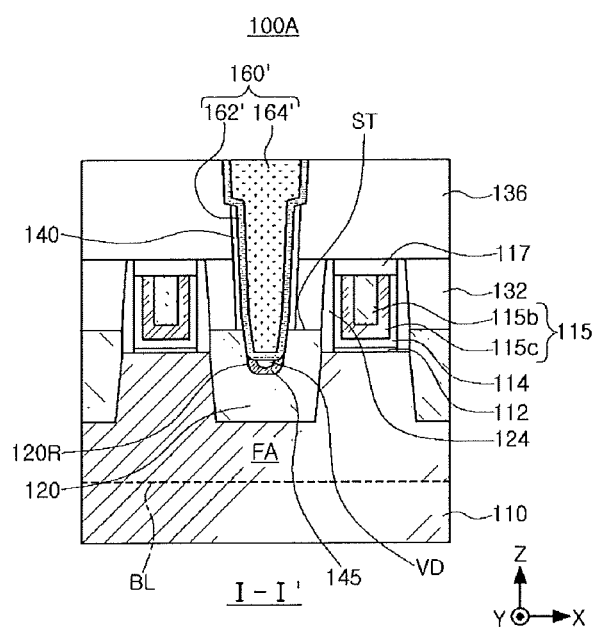
FIGS. 3A and 3B are cross-sectional views representing a semiconductor device according to an example embodiment.
Figure 3B:
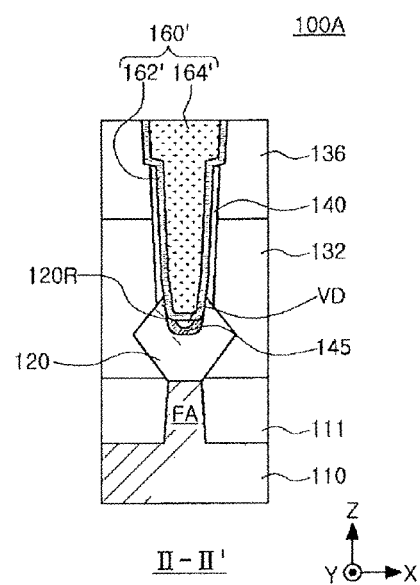

FIGS. 3A and 3B are cross-sectional views of a semiconductor device 100A according to an embodiment. FIG. 3A is a cross-sectional view corresponding to FIG. 2A, and similarly FIG. 3B is a cross-sectional view corresponding to FIG. 2B.

The semiconductor device 100A of FIGS. 3A and 3B may further comprise a contact spacer 140, when compared to the semiconductor device 100 of FIGS. 2A and 2B. Regarding the embodiment of the semiconductor device 100A of FIGS. 3A and 3B, a profile of a contact plug 160' is distinct, in comparison with the semiconductor device 100 of FIGS. 2A and 2B. In FIGS. 3A and 3B, the same reference numerals as in the previous embodiment denote the same parts of the semiconductor, and repeated descriptions thereof will thus be omitted, for convenience of the reader.

The semiconductor device 100A may further comprise the contact spacer 140 surrounding at least a lower portion of the contact plug 160'. The contact plug 160' may comprise a lower region surrounded by the contact spacer 140 and an upper region having a larger width than that of the lower region.

The contact spacer 140 may surround the contact plug 160' inside a first interlayer insulating layer 132, and an upper end of the contact spacer 140 may be extended to be higher than an upper surface of the same first interlayer insulating layer 132. The upper end of the contact spacer 140 may be located higher than an upper surface of the gate structure. A lower end of the contact spacer 140 is represented as being in contact with an upper end ST (or an upper surface) of the source/drain region 120; however, embodiments are not limited thereto. In some embodiments, the lower end of the contact spacer 140 may be extended to be at a vertical position that is lower than the upper end (or the upper surface) of the source/drain region 120.

In some embodiments, the contact spacer 140 may comprise, for example, silicon nitride, or other suitable spacer material.

Figure 4:
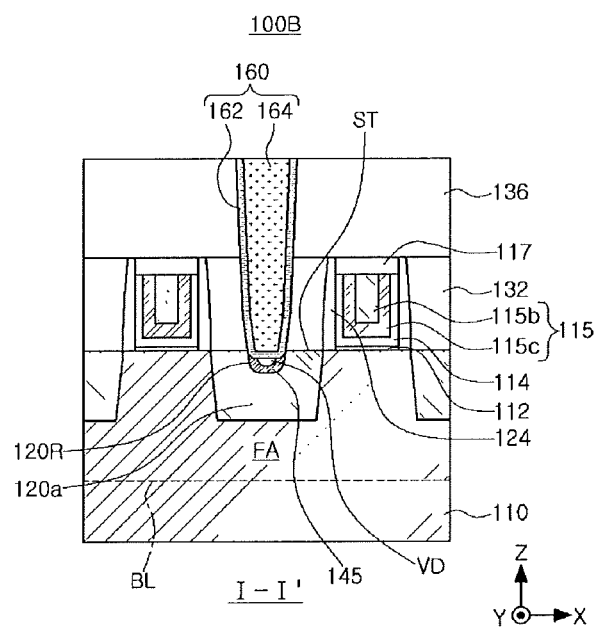
FIG. 4 is a cross-sectional view representing a semiconductor device according to an example embodiment in accordance with the present inventive concepts.

FIG. 4 is a cross-sectional view of a semiconductor device 100B according to an embodiment in accordance with the present inventive concepts. FIG. 4 is a cross-sectional view corresponding to FIG. 2A. In the semiconductor device 100B of FIG. 4, in a manner different from the semiconductor device 100 of FIG. 2A, source/drain regions 120a may have an upper end ST (or an upper surface) at substantially a similar level as that of an upper surface of a fin-type active region FA. The void VD may be located at a vertical position in the z-direction that is lower than an upper end ST of the source/drain region 120a. In addition, in other embodiments, the void VD may be located at a vertical position that is lower than a vertical position of the upper surface of the fin-type active region FA disposed below the gate structure.

In FIG. 4, the same reference numerals as in the previous example embodiment denote the same members, and repeated descriptions thereof will thus be omitted, for convenience of the reader.

Figure 5:
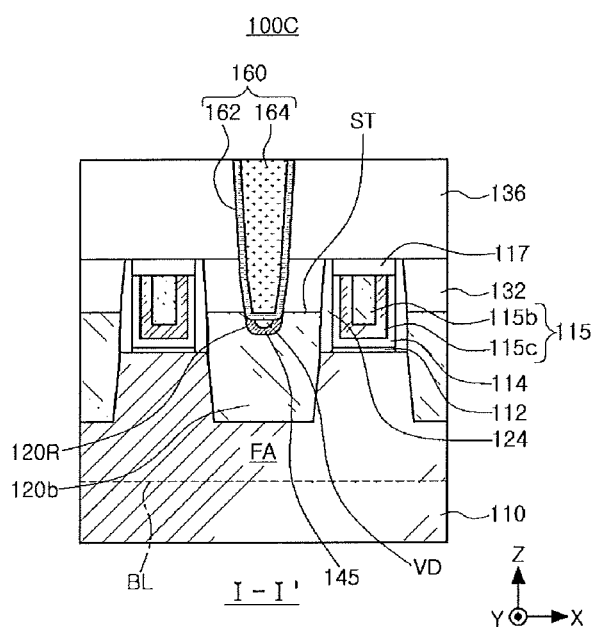
FIG. 5 is a cross-sectional view representing a semiconductor device according to an example embodiment in accordance with the present inventive concepts.

FIG. 5 is a cross-sectional view of a semiconductor device 100C according to an embodiment in accordance with the present inventive concepts. FIG. 5 is a cross-sectional view corresponding to FIG. 2A. In the semiconductor device 100C of FIG. 5, a level of an upper end ST (or an upper surface) of source/drain regions 120b may be higher in a vertical position in the z-direction, in comparison with the semiconductor device 100 of FIG. 2A. A void VD is located at a lower vertical position than an upper end of the source/drain region 120b. In other embodiments the void VD may be located at a vertical position that is higher than an upper surface of the fin-type active region FA disposed below the gate structure.

In FIG. 5, the same reference numerals as in the previous example embodiment denote the same members, and repeated descriptions thereof will thus be omitted, for convenience of the reader.

Figure 6:
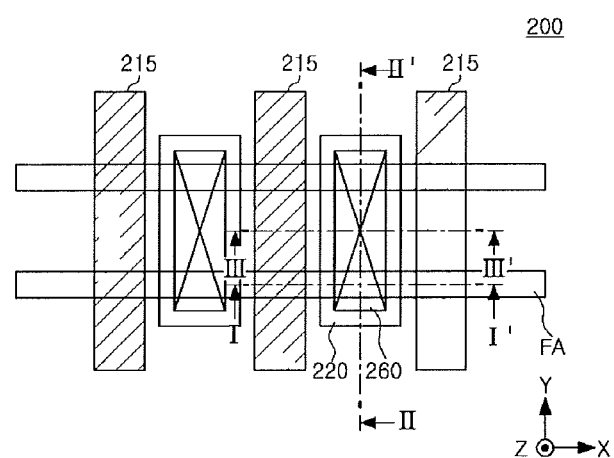
FIG. 6 is a layout view of a semiconductor device according to an example embodiment in accordance with the present inventive concepts.

FIG. 6 is a layout view of a semiconductor device 200 according to an example embodiment in accordance with the present inventive concepts.

Figure 7A:
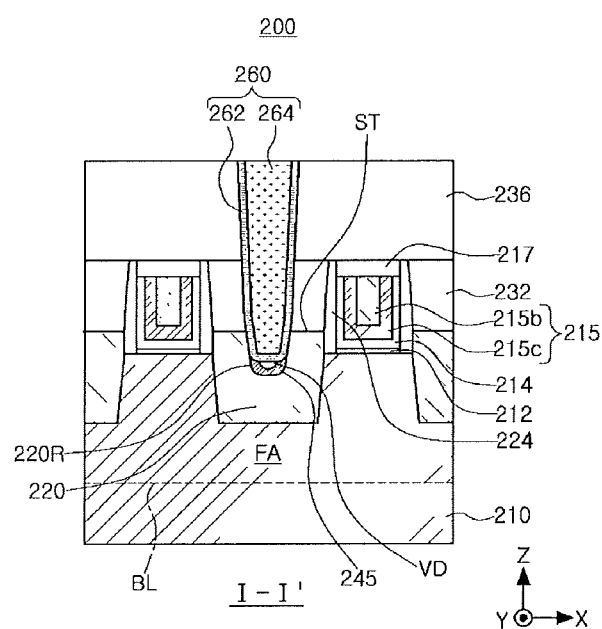
FIG. 7A is a cross-sectional view of the semiconductor device of FIG. 6 taken along line I-I'.
Figure 7B:
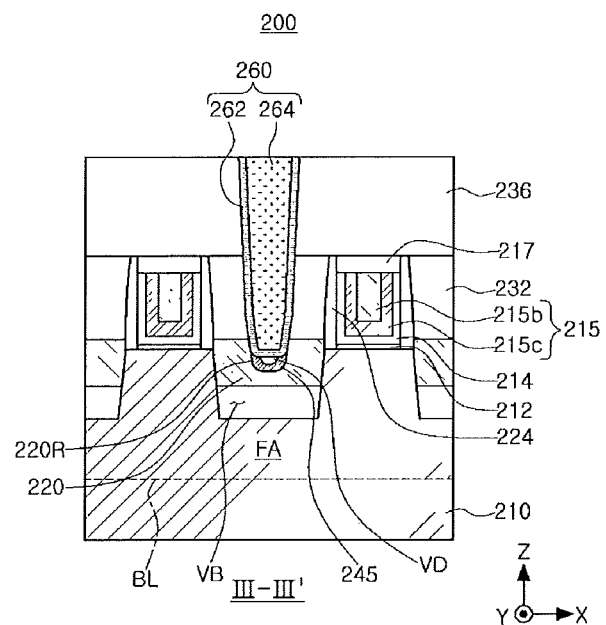
FIG. 7B is a cross-sectional view of the semiconductor device of FIG. 6 taken along line III-III'.
Figure 7C:
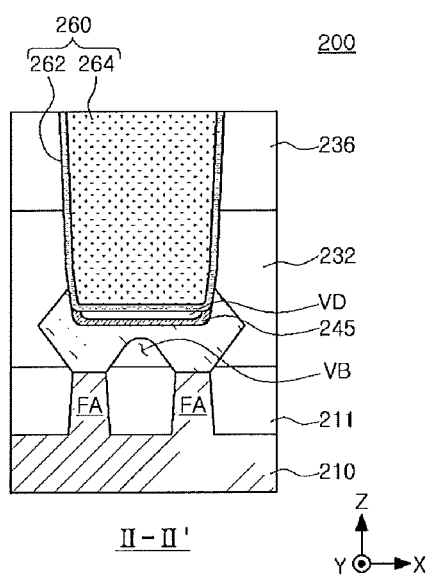
FIG. 7C is a cross-sectional view of the semiconductor device of FIG. 6 taken along line II-II'.

FIG. 7A is a cross-sectional view taken along line I-I' of the semiconductor device 200 of FIG. 6, similarly, FIG. 7B is a cross-sectional view taken along line III-III' of the semiconductor device 200 of FIG. 6, and furthermore, FIG. 7C is a cross-sectional view taken along line II-II' of the semiconductor device 200 of FIG. 6.

With reference to FIGS. 7A, 7B, and 7C, along with FIG. 6, the semiconductor device 200 may optionally comprise a substrate 210 having a plurality of fin-type active regions FA. Two fin-type active regions FA are represented by way of example, in the drawings. On the substrate 210, a lower sidewall of the dual fin-type active regions FA is covered with a device isolation layer 211. A bottom level of the fin-type active regions FA is indicated by a dotted line BL in FIG. 7A. The fin-type active region FA may be referred throughout the specification as an active fin.

On the fin-type active region FA, an interface insulating film 212, a gate insulating film 214, and a gate electrode 215 may be positioned. In some embodiments, the gate insulating film 214 and the gate electrode 215 may be extended in a second direction (labeled as a Y direction) intersecting the first direction (labeled as an X direction) while covering at least a portion of an upper surface and both side walls of the fin-type active regions FA, and an upper surface of the device isolation layer 211.

In some embodiments, the gate electrode 215 may comprise a first gate electrode 215b and a second gate electrode 215c. In some embodiments, the first gate electrode 215b and the second gate electrode 215c may be formed of different materials.

In some embodiments, the interface insulating film 212, the gate insulating film 214, and the gate electrode 215 may form a gate structure. Both side walls of the gate structure may be covered, or at least partially covered, with a gate spacer 224. An upper surface of the gate structure may be covered with a protective layer 217.

At both sides of the gate electrode 215, source/drain regions 220 are positioned in the fin-type active region FA. The source/drain regions 220 may include a semiconductor layer epitaxially grown from the fin-type active regions FA. In embodiments in accordance with the present inventive concepts, the source/drain regions 220 may include a recess region 220R. The source/drain regions 220 may be formed while having a structure in which the source/drain regions are merged with each other on a plurality of fin-type active regions FA. A lower void VB may be formed between a source/drain region 220 having been merged and the device isolation layer 211.

In some embodiments, the source/drain regions 220 may include a plurality of SiGe layers having been selectively epitaxially grown. The plurality of SiGe layers may have different Ge contents creating different rations for peak effectiveness. The plurality of SiGe layers may be doped with a p-type impurity. In some other embodiments, the source/drain regions 220 may be formed of a Si layer having been epitaxially grown or a SiC layer having been epitaxially grown. Conversely, the Si layer or the SiC layer may be doped with an n-type impurity.

In some embodiments, a first interlayer insulating film 232 is formed between a plurality of gate electrodes 215. A second interlayer insulating film 236 may be formed on the protective layer 217 and the first interlayer insulating film 232.

A contact plug 260 may be disposed on the recess region 220R of the source/drain region 220. The contact plug may be electrically connected to the source/drain region 220. In some embodiments, the contact plug 260 may pass through the second interlayer insulating film 236 and the first interlayer insulating film 232.

The contact plug 260 may comprise a conductive barrier layer 262 and a conductive layer 264. The conductive barrier layer 262 may encompass a lower surface and a side wall of the conductive layer 264.

A silicide layer 245 may be disposed on one region of the source/drain region 220. Furthermore, inside the recess region 220R of the source/drain region 220, the silicide layer 245 may be disposed between the source/drain regions 220 and a tip of the contact plug 260. Additionally, in some embodiments the silicide layer 245 may be disposed or positioned between the source/drain regions 220 and the conductive barrier layer 262 at a tip or distal end of the contact plug 260.

Figure 2C:
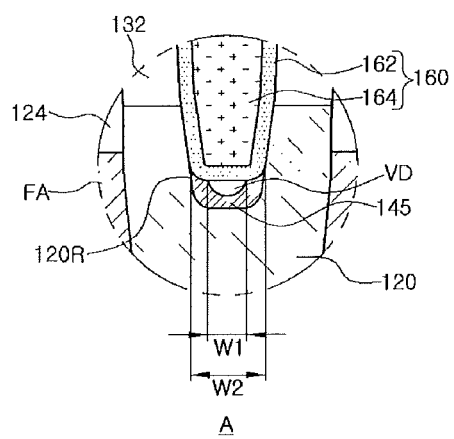
FIG. 2C is a partially enlarged view illustrating a portion of the semiconductor device of FIG. 2A.

In some embodiments, a void VD may be positioned between the silicide layer 245 and the contact plug 260. In other embodiments, the void VD may be disposed between the conductive barrier layer 262 and the silicide layer 245. The void VD may be integrally formed to be elongated on neighboring active regions FA. The void VD may be formed above the lower void VB, creating in essence a second void. In some embodiments, a width of the void VD may be narrower than a width of a lower portion of the contact plug 260, as described herein in connection with FIG. 2C. This allows for, at least a portion of the silicide layer 245 to be in contact with the conductive barrier layer 262. In other words, the void VD may be sealed by the silicide layer 245 and the conductive barrier layer 262.

In some embodiments, the void VD may be located at a vertical position in the Z-axis direction that is lower than an upper end of the source/drain region 220. In addition, the void VD may be located at a lower vertical position that is lower than an upper surface of the fin-type active region FA disposed or positioned below the gate structure. However, embodiments are not limited thereto.

In some embodiments, the semiconductor device 200 may further comprise a contact spacer having structure similar to that of the contact spacer 140 of FIGS. 3A and 3B. The contact spacer may be formed to surround at least a lower portion of the contact plug 260. In this embodiment, the contact plug 260 may comprise a lower region surrounded by the contact spacer and an upper region having a larger width than that of the lower region.

Figure 8:
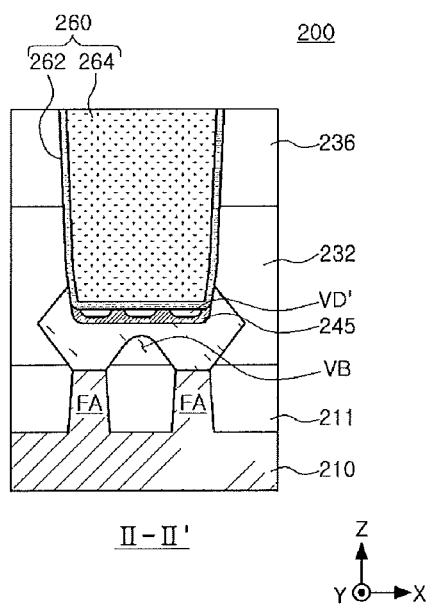
FIG. 8 is a cross-sectional view representing a semiconductor device according to an example embodiment in accordance with the present inventive concepts.

FIG. 8 is a cross-sectional view representing a semiconductor device according to an example embodiment.

A structure represented in FIG. 8 is a modification of a structure represented in FIG. 7C. As such, a plurality of voids VD' may be disposed between the contact plug 260 and a source/drain region 220. Sizes, including widths, heights, and volumes, of the plurality of voids Vd' may be different with respect to each other.

Figure 9:
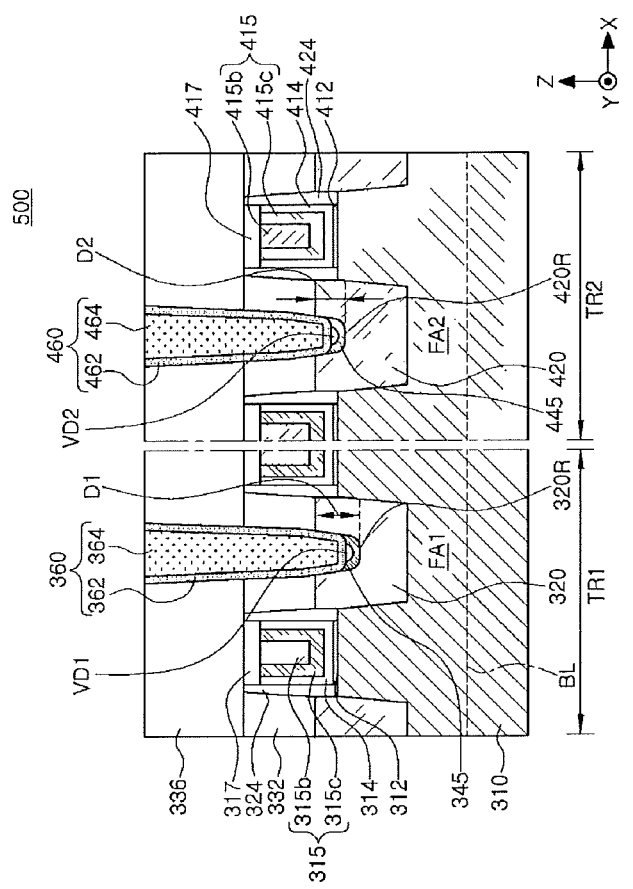
FIG. 9 is a cross-sectional view representing a semiconductor device according to an example embodiment in accordance with the present inventive concepts.

FIG. 9 is a cross-sectional view representing a semiconductor device according to an example embodiment.

In the embodiment of FIG. 9, in a semiconductor device 500, a substrate 310 may have a first device region TR1 and a second device region TR2.

The first device region TR1 and the second device region TR2 may have different electrical characteristics. In some embodiments, the first device region TR1 and the second device region TR2 may be regions having transistors of different channel types. For example, the first device region TR1 may be a region including a PMOS transistor, and the second device region TR2 may be a region including an NMOS transistor.

In some embodiments, the first device region TR1 and the second device region TR2 may be structures formed in a similar manner to the previous embodiments. In the first device region TR1, a first fin-type active region FA1, a first interface insulating film 312, a first gate insulating film 314, a first gate electrode 315, a first gate spacer 324, a first protective layer 317, a first source/drain region 320, a first silicide layer 345, a first contact plug 360, and a first void VD1 are positioned. Similarly, in the second device region TR2, a second fin-type active region FA2, a second interface insulating film 412, a second gate insulating film 414, a second gate electrode 415, a second gate spacer 424, a second protective layer 417, a second source/drain region 420, a second silicide layer 445, a second contact plug 460, and a second void VD2 are also positioned.

However, a first depth D1 of a bottom surface of the first silicide layer 345 of a PMOS transistor formed in the first device region TR1 may be different from a second depth D2 of a bottom surface of the second silicide layer 445 of an NMOS transistor formed in the second device region TR2. For example, as represented in FIG. 9, the first depth D1 may be deeper in the vertical z-direction than the second depth D2. Therefore, a first void VD1 may be located at a lower vertical position than a second void VD2. Because an etching rate of the first source/drain regions 320 of a PMOS transistor is higher than that of the second source/drain regions 420 of an NMOS transistor in an etching process of forming a contact hole, the first depth D1 may be formed to be deeper than the second depth D2.

Furthermore, in some embodiments, a width of the first void VD1 may be less than a width of a lower portion of the first contact plug 360, and a width of the second void VD2 may be less than a width of a lower portion of the second contact plug 460. The first void VD1 may be located at a lower vertical position than an upper surface of the first active region FA1. The second void VD2 may be located on the same level as that of an upper surface of the second active region FA2, however, embodiments of the present inventive concepts are not limited thereto. For example, the second void VD2 may optionally be located at a vertical position that is higher or lower than that of the upper surface of the second active region FA2.

The first contact plug 360 may include a first conductive barrier layer 362 and a first conductive layer 364, and the second contact plug 460 may include a second conductive barrier layer 462 and a second conductive layer 464. The first void VD1 may be sealed by the first silicide layer 345 and the first conductive barrier layer 362, and the second void VD2 may be sealed by the second silicide layer 445 and the second conductive barrier layer 462.

In the first device region TR1, a vertical position of a bottom surface of a recess region 320R formed in the first source/drain region 320 may correspond to the first depth D1. In the second device region TR2, a vertical position of a bottom surface of a recess region 420R formed in the second source/drain region 420 may correspond to the second depth D2.

Meanwhile, a level of an upper surface of the first source/drain region 320 formed in the first device region TR1 may be the same as a level of an upper surface of the second source/drain region 420 formed in the second device region TR2. Alternatively, the level of an upper surface of the first source/drain region 320 formed in the first device region TR1 may be different from a level of an upper surface of the second source/drain region 420 formed in the second device region TR2.

In some embodiments, the semiconductor device 500 may further include a first contact spacer and a second contact spacer having a structure similar to that of the contact spacer 140 of FIGS. 3A and 3B. The first contact spacer may be formed to surround at least a lower portion of the first contact plug 360 of the first device region TR1, and the second contact spacer may be formed to surround at least a lower portion of the second contact plug 460 of the second device region TR2. In this case, the first contact plug 360 may include a lower region surrounded by the first contact spacer and an upper region having a larger width than that of the lower region. The second contact plug 460 may include a lower region surrounded by the second contact spacer and an upper region having a larger width than that of the lower region.

Figure 10:
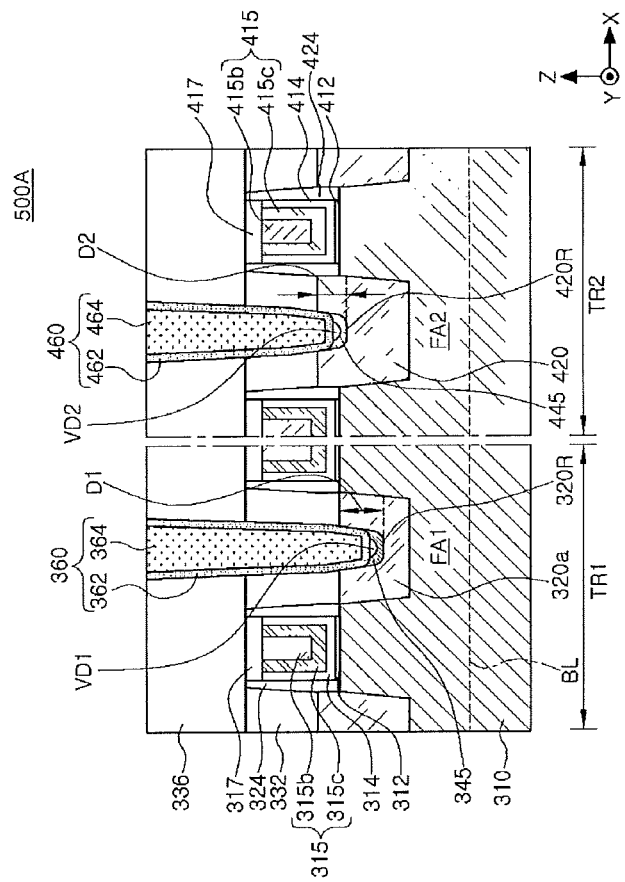
FIG. 10 is a cross-sectional view representing a semiconductor device according to an example embodiment in accordance with the present inventive concepts.

FIG. 10 is a cross-sectional view of a semiconductor device 500A according to an embodiment.

In the semiconductor device 500A of FIG. 10 this embodiment is, in some ways, distinct from the semiconductor device 500 of FIG. 9, in that first source/drain regions 320a formed in a first device region TR1 may have an upper end (or an upper surface) at substantially the same level as an upper surface of the fin-type active region FA.

A level of an upper surface of the first source/drain region 320a formed in the first device region TR1 may be lower than a level of an upper surface or upper of the second source/drain region 420 formed in the second device region TR2. The first void VD1 may be located at a lower vertical position in the z-direction than the second void VD2.

In FIG. 10, the same reference numerals as in the previous example embodiment denote the same elements, and repeated descriptions thereof will thus be omitted, for convenience of the reader.

Figure 11:
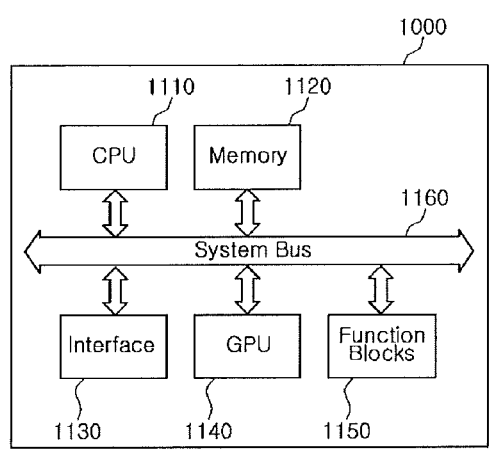
FIG. 11 is a view schematically representing a configuration of a System-on-Chip (SoC) implemented as a semi-

FIG. 11 schematically represents a configuration of a System-on-Chip (SoC) implemented as a semiconductor device according to an embodiment.

With reference to FIG. 11, a System-on-Chip (SoC) 1000 may comprise a central processing unit 1110, a memory 1120, an interface 1130, a graphics processing unit 1140, functional blocks 1150, and a bus 1160 connecting the system. The central processing unit 1110 may control an operation of the SoC 1000. The central processing unit 1110 may include a core and an L2 cache. For example, the central processing unit 1110 may include a multi-core.

Respective cores of the multi-core may have the same or different levels of performance. In addition, respective cores of the multi-core may be activated at the same time or may be activated at different times. The memory 1120 may store a result processed in the functional blocks 1150 by control of the central processing unit 1110, or the like. For example, as contents stored in the L2 cache of the central processing unit 1110 is flushed, the contents may be stored in the memory 1120. The interface 1130 may perform an interface with external devices. For example, the interface 1130 may perform an interface with a camera, a liquid crystal display (LCD), a speaker, and the like.

The graphics processing unit 1140 may perform graphics functions required for a system-on-chip (SoC). One example may include, the graphics processing unit 1140 may perform a function of a video codec, or may process 3D graphics. The functional blocks 1150 may perform various functions required for SoC. For example, when the SoC 1000 is an access point (AP) used in a mobile device, some of the functional blocks 1150 may perform a communication function. The SoC 1000 may include at least one of semiconductor devices 100, 100A, 100B, 100C, 200, 500, and 500A according to example embodiments.

As set forth above, according to various embodiments of the present inventive concept, a novel semiconductor device having a void below a contact plug may be provided.

The embodiments of the present disclosure have been described with reference to the attached drawings, but it may be understood by those of ordinary skill in the art that the present disclosure may be performed by those of ordinary skill in the art in other specific forms without changing the technical concept or essential features of the present disclosure. Further, the above-described embodiments are merely examples or various embodiments and do not limit the scope of the rights of the present disclosure.

What is claimed is:

1. A semiconductor device, comprising:
an active fin extended in a first direction on a substrate;
a gate structure extended in a second direction, wherein the gate structure intersects the active fin, and covers an upper portion of the active fin;
a source/drain region on the active fin adjacent to the gate structure;
a silicide layer on the source/drain region;
a contact plug connected to the source/drain region; and
a void between the silicide layer and the contact plug.

2. The semiconductor device of claim 1, wherein the contact plug includes a conductive barrier layer and a conductive layer, and wherein the void is positioned between the conductive barrier layer and the silicide layer.

3. The semiconductor device of claim 2, wherein at least a portion of the silicide layer is in contact with the conductive barrier layer.

4. The semiconductor device of claim 1, wherein the void is located at a vertical position that is lower than a vertical position of an upper end of the source/drain region.

5. The semiconductor device of claim 1, wherein the void is located at a vertical position that is lower than a vertical position of an upper surface of the active fin.

6. The semiconductor device of claim 1, wherein a width of the void is less than a width of a lower portion of the contact plug.

7. The semiconductor device of claim 1, further comprising a contact spacer surrounding at least a lower portion of the contact plug.

8. The semiconductor device of claim 1, wherein the silicide layer is positioned between the contact plug and the source/drain region.

9. The semiconductor device of claim 1, wherein the source/drain region comprises silicon-germanium doped with a p-type impurity.

10. The semiconductor device of claim 1, wherein the source/drain region comprises silicon doped with an n-type impurity.

11. A semiconductor device, comprising:
a substrate having a first active region and a second active region containing impurities having different conductivity types;
a first source/drain region in the first active region, and having an upper surface in which a first recess region is formed;
a first contact plug on the first recess region of the first source/drain region;
a first void between the first source/drain region and the first contact plug;
a second source/drain region in the second active region, and having an upper surface in which a second recess region is formed;
a second contact plug on the second recess region of the second source/drain region; and
a second void between the second source/drain region and the second contact plug,
wherein the first void is located at a vertical position that is lower than a vertical position of the second void.

12. The semiconductor device of claim 11, wherein a width of the first void is less than a width of a lower portion of the first contact plug, and
wherein a width of the second void is less than a width of a lower portion of the second contact plug.

13. The semiconductor device of claim 11, further comprising a first silicide layer between the first contact plug and the first source/drain region and a second silicide layer between the second contact plug and the second source/drain region,
wherein the first contact plug includes a first conductive barrier layer and a first conductive layer,
wherein the second contact plug includes a second conductive barrier layer and a second conductive layer,
wherein the first void is sealed by the first silicide layer and the first conductive barrier layer, and
wherein the second void is sealed by the second silicide layer and the second conductive barrier layer.

14. The semiconductor device of claim 11, wherein the first void is located at a vertical position that is lower than a vertical position of an upper surface of the first active region.

15. The semiconductor device of claim 11, further comprising a first contact spacer surrounding at least a lower portion of the first contact plug and a second contact spacer surrounding at least a lower portion of the second contact plug.

16. A semiconductor device, comprising:
an active fin extending in a first horizontal direction on a substrate;
a gate structure extending in a second horizontal direction on the substrate, the second horizontal direction different than the first horizontal direction, the gate structure intersecting the active fin and covering an upper portion of the active fin;
a source/drain region on the active fin at a lower side portion of the gate structure;
a silicide layer on the source/drain region;
a contact plug on the source/drain region, the contact plug extending in a vertical direction relative to the first horizontal direction and the second horizontal direction, a lower portion of the contact plug in contact with at least a portion of the silicide layer; and
a void between the silicide layer and the contact plug.

17. The semiconductor device of claim 16, wherein the contact plug includes a conductive barrier layer and a conductive layer, and wherein the void is between the conductive barrier layer and the silicide layer.

18. The semiconductor device of claim 16, wherein the void is located at a vertical position that is lower than a vertical position of an upper end of the source/drain region.

19. The semiconductor device of claim 16, wherein the void is located at a vertical position that is lower than a vertical position of an upper surface of the active fin.

20. The semiconductor device of claim 16, wherein a width of the void is less than a width of the lower portion of the contact plug.

* * * * *